US009014768B2

(12) United States Patent
Nagasu et al.

(10) Patent No.: US 9,014,768 B2
(45) Date of Patent: Apr. 21, 2015

(54) METHOD OF PRODUCING SUPERCONDUCTING CONDUCTOR, SUPERCONDUCTING CONDUCTOR, AND SUBSTRATE FOR SUPERCONDUCTING CONDUCTOR

(75) Inventors: Yoshinori Nagasu, Tokyo (JP); Hisaki Sakamoto, Tokyo (JP); Masaru Higuchi, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 150 days.

(21) Appl. No.: 13/814,569

(22) PCT Filed: Aug. 2, 2012

(86) PCT No.: PCT/JP2012/069750
§ 371 (c)(1),
(2), (4) Date: Feb. 6, 2013

(87) PCT Pub. No.: WO2013/018870
PCT Pub. Date: Feb. 7, 2013

(65) Prior Publication Data
US 2013/0137579 A1 May 30, 2013

(30) Foreign Application Priority Data

Aug. 2, 2011 (JP) ................. 2011-169608

(51) Int. Cl.
*H01L 39/24* (2006.01)
*H01B 12/02* (2006.01)
*H01L 39/14* (2006.01)
(52) U.S. Cl.
CPC .............. *H01B 12/02* (2013.01); *H01L 39/143* (2013.01); *H01L 39/2461* (2013.01); *H01L 39/2454* (2013.01)

(58) Field of Classification Search
CPC . H01L 39/2419; H01L 39/2487; B01D 53/22
See application file for complete search history.

(56) References Cited

U.S. PATENT DOCUMENTS

2008/0004174 A1* 1/2008 Itoh et al. .................. 502/100
2008/0261072 A1* 10/2008 Kashima et al. ............ 428/677

FOREIGN PATENT DOCUMENTS

| JP | 64-65721 | * | 3/1989 |
| JP | 64 65721 | | 3/1989 |
| JP | 6 68727 | | 3/1994 |
| JP | 2007 141688 | | 6/2007 |
| JP | 2007 287629 | | 11/2007 |
| JP | 2008 266686 | | 11/2008 |
| JP | 2008-266686 | * | 11/2008 |
| JP | 2010 192116 | | 9/2010 |

OTHER PUBLICATIONS

International Search Report Issued Sep. 11, 2012 in PCT/JP12/69750 Filed Aug. 2, 2012 (with Translation of Category).

* cited by examiner

*Primary Examiner* — Colleen Dunn
(74) *Attorney, Agent, or Firm* — Oblon, McClelland, Maier & Neustadt, L.L.P.

(57) ABSTRACT

A method for producing a superconductive conductor includes: a base material preparation process of preparing a base material having a groove formed on at least one face thereof; a superconducting layer formation process of forming a superconducting layer on a surface of the base material at a side at which the groove is formed; and a cutting process of cutting completely through the base material along the groove.

19 Claims, 11 Drawing Sheets

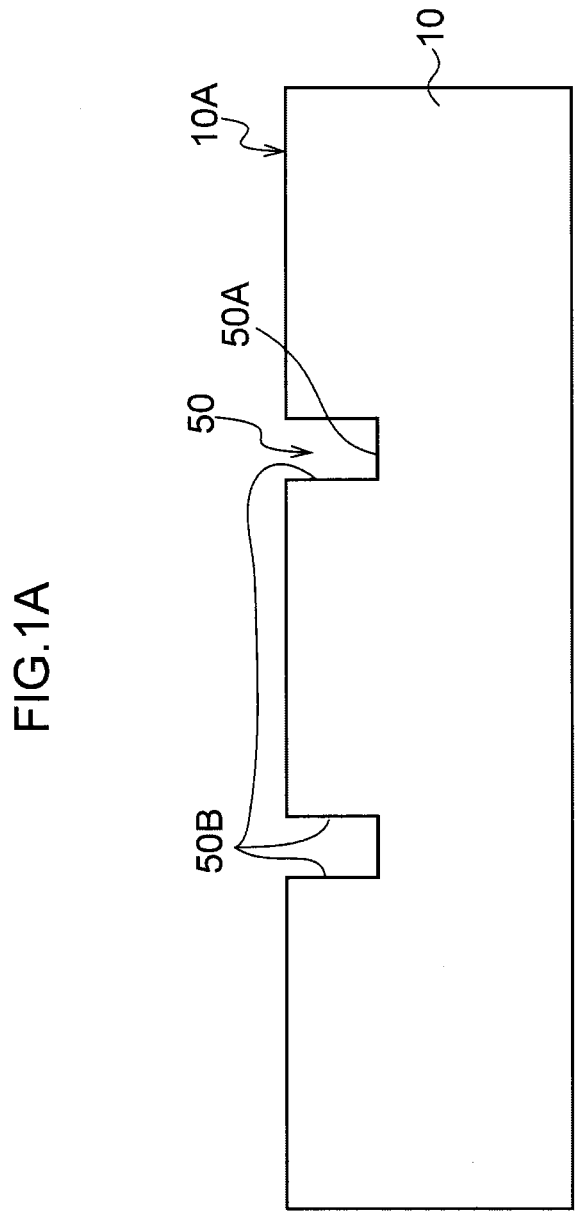

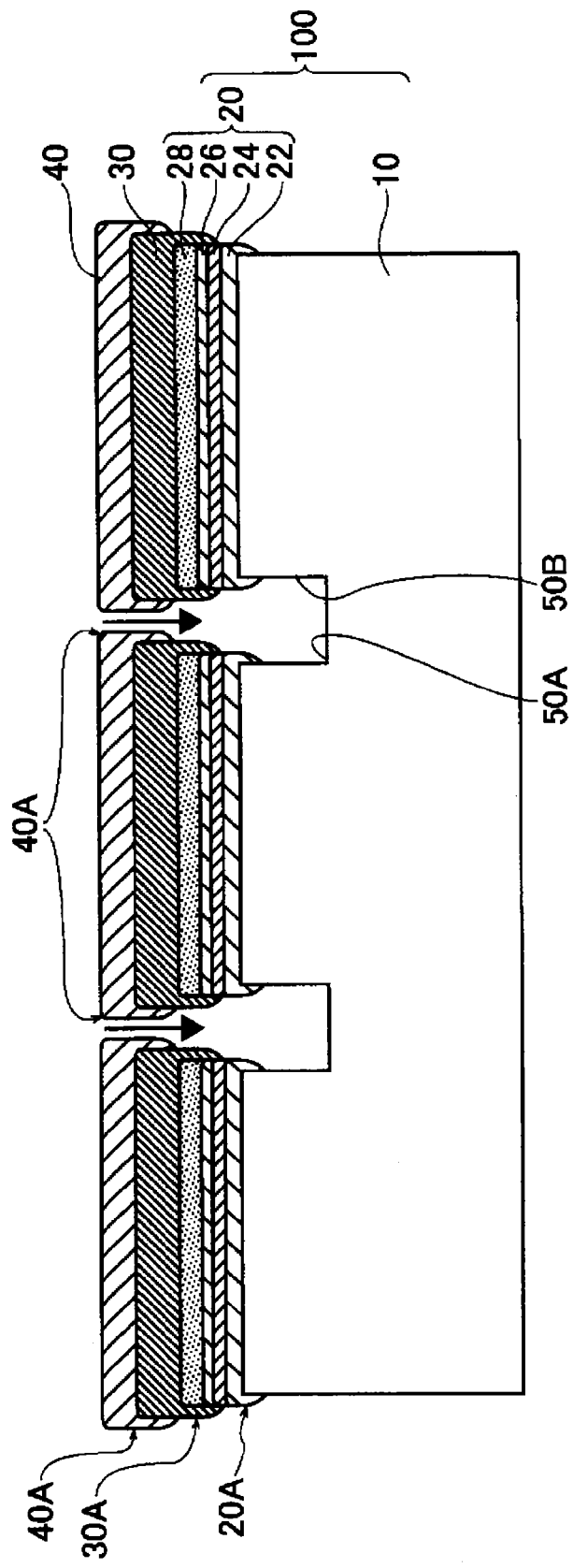

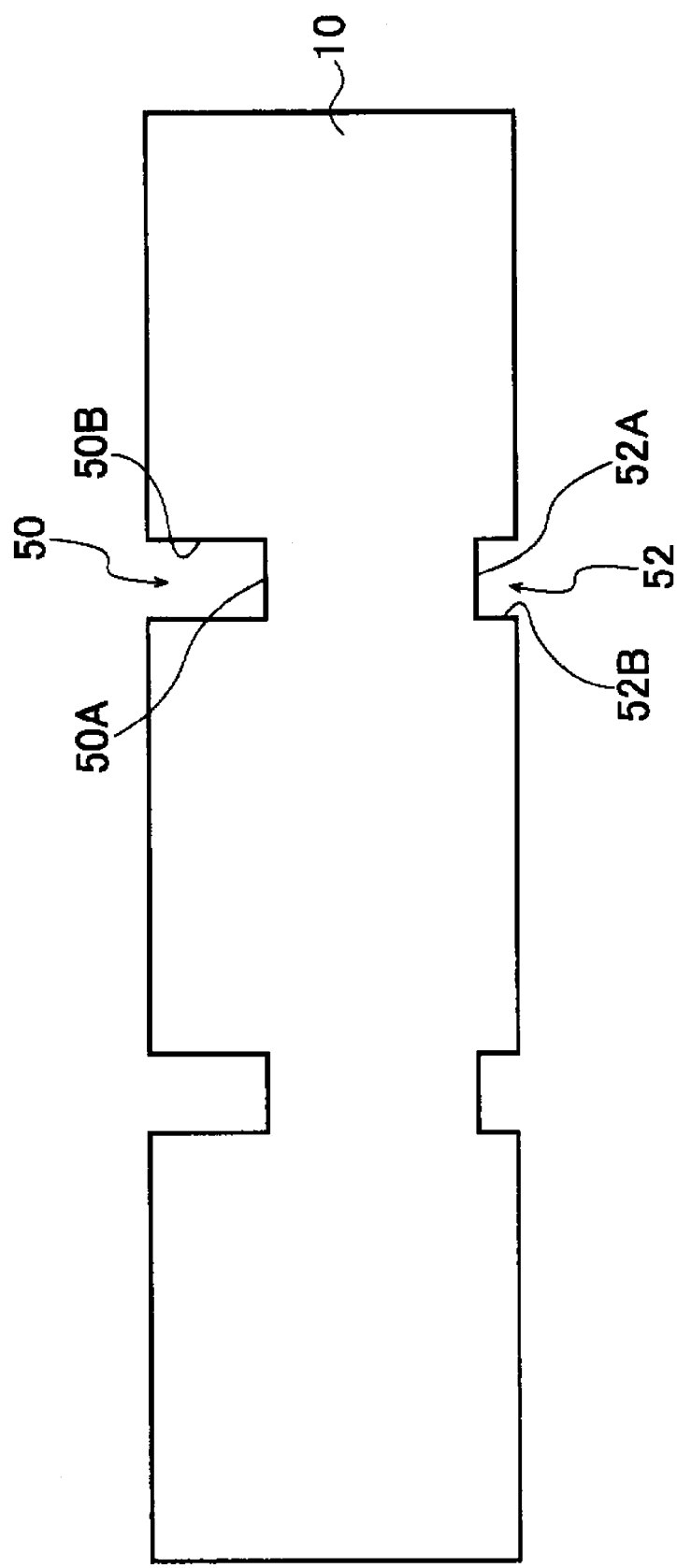

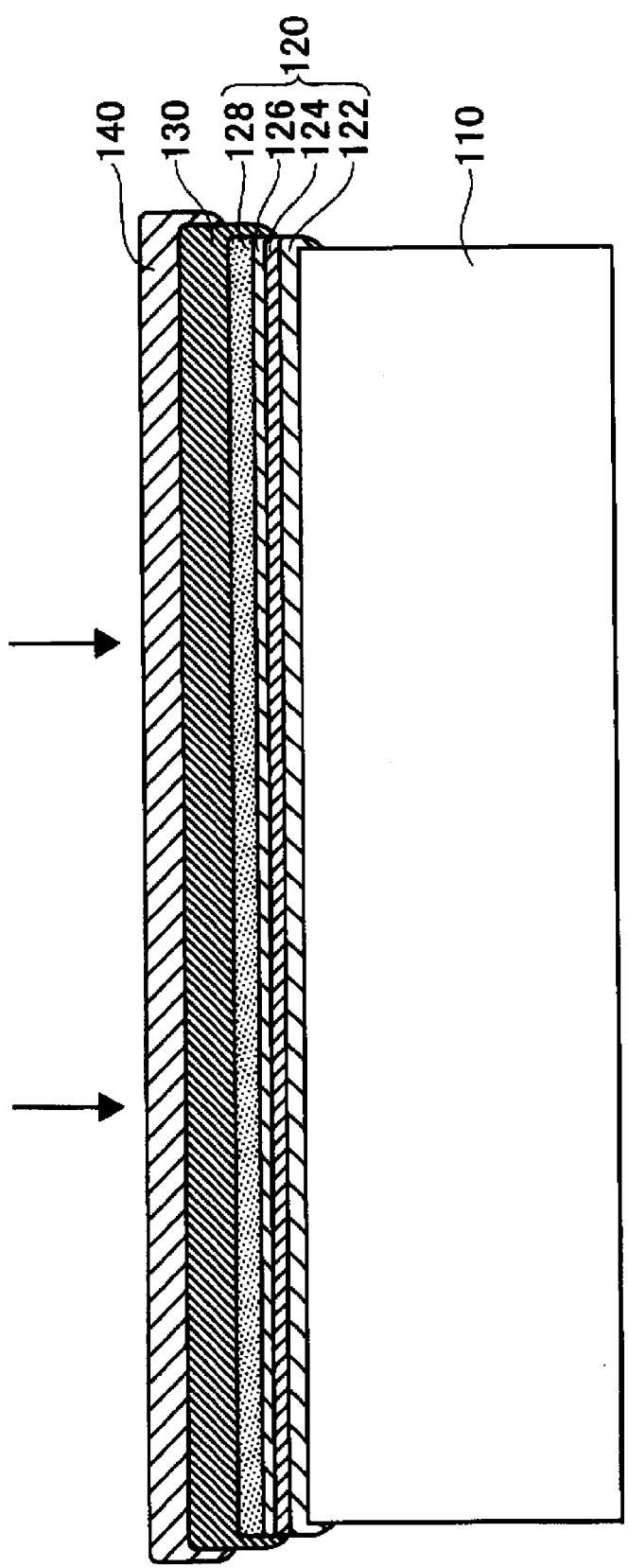

FIG.6B
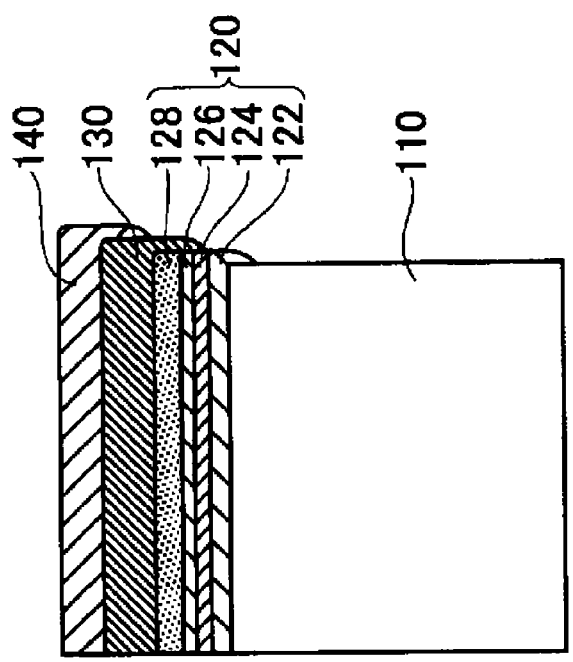
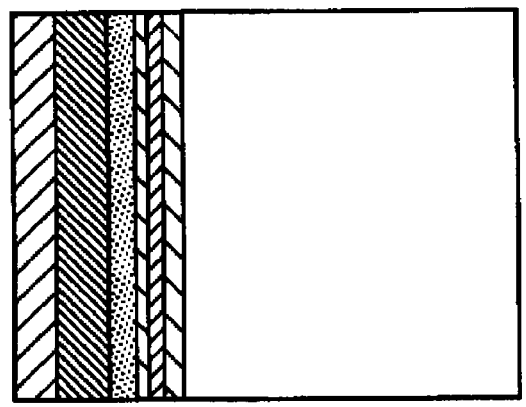
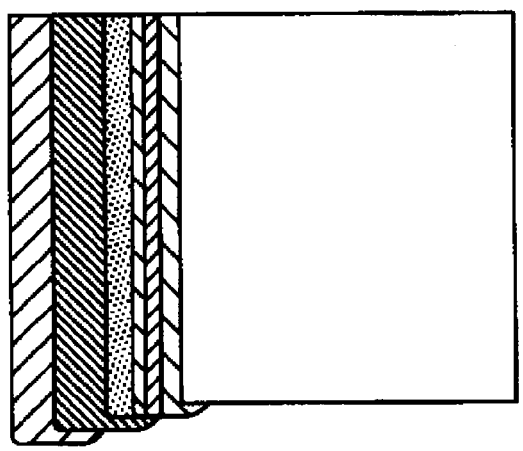

METHOD OF PRODUCING SUPERCONDUCTING CONDUCTOR, SUPERCONDUCTING CONDUCTOR, AND SUBSTRATE FOR SUPERCONDUCTING CONDUCTOR

CROSS REFERENCE TO RELATED APPLICATIONS

The present application is a 35 U.S.C. §371 national stage patent application of International patent application PCT/JP2012/069750, filed on Aug. 2, 2012, the text of which is incorporated by reference, and claims the benefit of the filing date of Japanese application no. 2011-169608, filed on Aug. 2, 2011, the text of which is also incorporated by reference.

TECHNICAL FIELD

The present invention relates to a method for producing superconductive conductor for use in superconducting devices such as superconducting cables and superconducting magnets, a superconductive conductor, and a substrate for a superconductive conductor.

BACKGROUND ART

Many attempts to produce a superconductive conductor by forming a superconducting layer on a base material have been proposed. For example, with regard to the provision of a superconducting wire material having a desired wire material width, there is a method in which a metallic substrate having a desired width is prepared in a first stage of the production, an intermediate layer is formed on a surface of the substrate, and a superconducting layer having satisfactory crystal orientation is formed on a surface of the intermediate layer. Further, for further decreasing the thickness of the superconducting wire material obtained, a method of cutting using a laser or a method of cutting using slit processing is employed.

For example, an example of the slit processing is disclosed in Japanese Patent Application Laid-Open (JP-A) No. 6-68727. In the method disclosed therein, in a process of polishing a surface of a base material and forming an oxide high-temperature superconducting film on the polished surface of the base material by, for example, laser abrasion, the polished base material is cut completely through and divided into plural pieces and a superconducting film is then formed on the plural pieces, or the base material on which a superconducting film is formed is cut completely through to obtain plural superconducting wires.

Another example of the slit processing is disclosed in Japanese Patent Application Laid-Open (JP-A) No. 2007-287629. The method disclosed therein includes a step of preparing a superconducting wire material and a processing step of cutting completely through the superconducting wire material by a processing section having two cutter portions that face each other. At least two processing sections are arranged adjacent to each other in the width direction of the superconducting wire material with a gap therebetween, so as to allow a superconducting wire material to be sandwiched between the two cutter portions, wherein a contact position of one cutter portion that contacts one surface of the superconducting wire material is disposed outer side in the width direction of the superconducting wire material, than the contact position of the other cutter portion that contacts the other surface of the superconducting wire material.

Japanese Patent Application Laid-Open (JP-A) No. 2007-141688 discloses, as an example of the laser cutting, a method which includes: providing a low AC loss superconductive conductor which includes an oxide superconducting layer provided on a substrate, wherein the oxide superconducting layer is separated into plural filament conductors by plural grooves for thinning that extend along a longitudinal direction of the substrate and that are arranged in the width direction of the substrate; and forming a high-resistance oxide in the grooves for thinning.

In addition, Japanese Patent Application Laid-Open (JP-A) No. 2010-192116 discloses that a superconducting wire material has a structure in which an intermediate layer and a superconducting layer are sequentially formed and layered on a substrate, and covered with a protective layer. JP-A No. 2010-192116 further discloses a method for forming a slit in the substrate, and the slit satisfies requirements of 1) the slit is formed on a face of the substrate at a side opposite to the face on which the superconducting layer is formed, 2) the slit has a depth penetrating into part of the thickness of the substrate, and 3) at least one slit is present in any cross-section orthogonal to the longitudinal direction of the superconducting wire material.

PRIOR ART DOCUMENTS

Patent Documents

[Patent Document 1] Japanese Patent Application Laid-Open (JP-A) No. 6-68727
[Patent Document 2] Japanese Patent Application Laid-Open (JP-A) No. 2007-287629
[Patent Document 3] Japanese Patent Application Laid-Open (JP-A) No. 2007-141688
[Patent Document 4] Japanese Patent Application Laid-Open (JP-A) No. 2010-192116

SUMMARY OF INVENTION

Technical Problem

However, for example, cutting methods using a laser have problems in that fusion cutting traces due to heat generation appear on the cut face formed by laser cutting, which makes the shape of the cut face non-uniform, and resultantly deteriorates the insulation characteristics of the superconductive conductor due to the presence of local protrusions on the cut face, and in that the superconducting characteristics (threshold current characteristics) deteriorate due to thermal hysteresis generated at the time of cutting. Cutting methods employing slit processing also have problems in that, similar to the generation of fusion cutting traces generated by laser cutting, protruding traces (so-called burr) are generated at a cut portion due to shearing, which makes the shape of the cut face non-uniform, and resultantly deteriorate the insulation characteristics of the superconductive conductor, and in that the superconducting characteristics are deteriorated by shearing stress.

Methods of cutting using lasers, etc. are employed not only in cases in which cutting is carried out all through the substrate and the layers formed on the substrate, but also in a case in which cutting is carried out only thorough the layers disposed on a substrate, such as a protective layer, a superconducting layer and an intermediate layer, so as to form a superconductive conductor having divisional portions of the superconducting layer on one substrate. Also in this case, there are a problem of generation of the fusion cutting traces, a problem from the viewpoint of utility as a superconductive conductor such as a local decrease in threshold current characteristics accompanying the generation of the fusion cutting traces, and a problem from the viewpoint of utility as an application device such as instability and a decrease in uniformity.

The present invention has been made in consideration of the above-described circumstances, and an object thereof is to provide a superconductive conductor production method capable of suppressing deterioration of insulation characteristics and superconducting characteristics during thinning processing, a superconductive conductor, and a substrate for a superconductive conductor for use in the superconductive conductor production method.

Solution to Problem

The above-described object of the invention is accomplished by the following aspects.

<1> A method for producing a superconductive conductor, the method including:
a base material preparation process of preparing a base material having a first groove formed on at least one face thereof;
a superconducting layer formation process of forming a superconducting layer on a surface of the base material at a side at which the first groove is formed; and
a cutting process of cutting completely through the base material along the first groove.

<2> The method for producing a superconductive conductor according to <1>, wherein the depth of the first groove is the same as or greater than the thickness of the superconducting layer, but less than the thickness of the base material.

<3> The method for producing a superconductive conductor according to <1> or <2>, wherein the opening area of the uppermost portion of the first groove is larger than the area of the bottom face of the first groove.

<4> The method for producing a superconductive conductor according to any one of <1> to <3>, wherein the surface roughness Ra of the inner wall faces of the first groove is 0.02 μm or more.

<5> The method for producing a superconductive conductor according to any one of <1> to <4>, wherein the base material preparation process includes a substrate preparation process of preparing a substrate, and an intermediate layer formation process of forming an intermediate layer on a surface of the substrate.

<6> The method for producing a superconductive conductor according to <5>, wherein the first groove is formed on at least one face of the substrate, and the intermediate layer formation process includes forming the intermediate layer on a surface at a side at which the first groove is formed.

<7> The method for producing a superconductive conductor according to any one of <1> to <6>, wherein the base material prepared in the base material preparation process further has a second groove on a face of the base material at a side opposite to the face at a side at which the first groove is formed.

<8> The method for producing a superconductive conductor according to any one of <1> to <7>, wherein the first groove is formed continuously from one end of the base material to the other end of the base material.

<9> The method for producing a superconductive conductor according to any one of <5> to <8>, wherein the cutting process is carried out after at least the intermediate layer formation process is carried out.

<10> The method for producing a superconductive conductor according to any one of <1> to <9>, wherein the cutting process is carried out after the superconducting layer formation process.

<11> A superconductive conductor including:
a base material having a first groove on at least one face thereof; and
a superconducting layer that is formed on a surface of the base material at a side at which the first groove is formed, except on at least the first groove,
wherein the superconducting layer is formed to cover corner portions at which the face of the base material on which the superconducting layer is formed contacts the respective inner wall faces of the first groove of the base material.

<12> The superconductive conductor according to <11>, wherein the depth of the first groove is the same as or greater than the thickness of the superconducting layer but less than the thickness of the base material.

<13> The superconductive conductor according to <11> or <12>, wherein the surface roughness Ra of the inner wall faces of the first groove is 0.02 μm or more.

<14> The superconductive conductor according to any one of <11> to <13>, wherein the base material further has a second groove on a face of the base material opposite to the face at a side at which the first groove is formed.

<15> The superconductive conductor according to any one of <11> to <14>, wherein the first groove is formed continuously from one end of the base material to the other end of the base material.

<16> A substrate for a superconductive conductor, one face of the substrate having a surface roughness Ra of less than 0.02 μm, wherein a first groove is formed on the one face.

<17> The substrate for a superconductive conductor according to <16>, wherein each side face of the substrate, each inner wall face of the first groove, and the bottom face of the first groove has a surface roughness Ra of 0.02 μm or more.

<18> The substrate for a superconductive conductor according to <16> or <17>, further including a second groove on a face of the substrate opposite to the face at a side at which the first groove is formed.

Advantageous Effects of Invention

According to the invention, a superconductive conductor production method capable of suppressing deterioration of insulation characteristics and superconducting characteristics during thinning processing, a superconductive conductor, and a substrate for a superconductive conductor for use in the superconductive conductor production method, can be provided.

BRIEF DESCRIPTION OF DRAWINGS

FIG. 1A is a schematic cross-sectional diagram illustrating a stage in a substrate preparation process in a production method according to the invention.

FIG. 2A is a schematic cross-sectional diagram illustrating a stage in a cutting process in a production method according to the invention.

FIG. 3 is a schematic cross-sectional diagram illustrating a substrate having grooves on one face and second grooves on the other face.

FIG. 6A is a schematic cross-sectional diagram illustrating a production process in a conventional production method.

FIG. 6B is a schematic cross-sectional diagram illustrating a production process in a conventional production method.

DESCRIPTION OF EMBODIMENTS

Figure 1B:
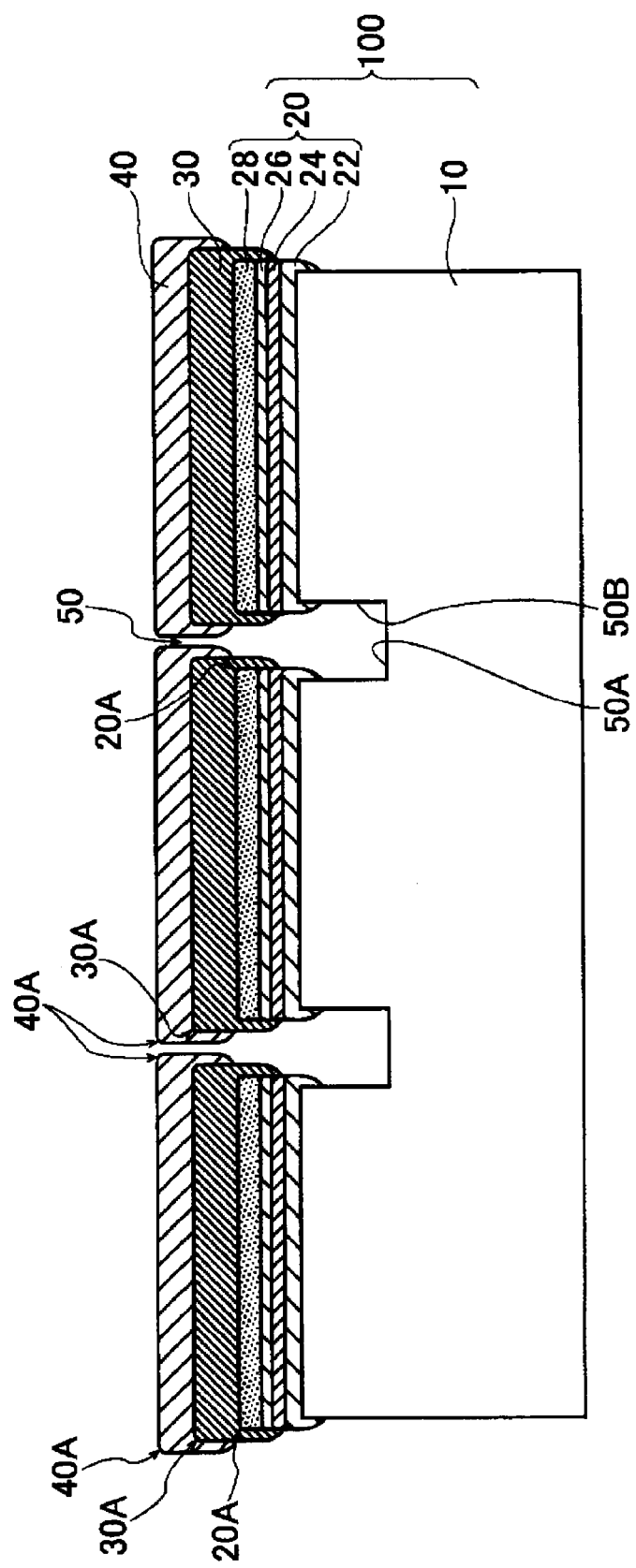
FIG. 1B is a schematic cross-sectional diagram illustrating a stage in an intermediate layer formation process, a superconducting layer formation process, and a protective layer formation process in a production method according to the invention.

A method for producing a superconductive conductor of the invention includes a base material preparation process of preparing a base material having a groove formed on at least one face thereof, a superconducting layer formation process of forming a superconducting layer on a surface of the base material at a side at which the groove is formed, and a cutting process of cutting completely through the base material along the groove.

A superconductive conductor of the invention produced by the production method according to the above-described embodiment includes:

a base material having a groove on at least one face thereof; and a superconducting layer formed on a surface of the base material at a side at which the groove is formed, except on at least the groove, wherein the superconducting layer is formed to cover corner portions at which the face of the base material on which the superconducting layer is formed contacts the respective inner wall faces of the groove of the base material. That is, in the case of assuming that a face of the base material at the superconducting layer side is a front face, and that a face opposite to the front face is a rear face, and that the bottom of the groove is a bottom face, and that the other faces of the groove than the bottom face are inner wall faces, and that the other faces than the rear face, the bottom face, the inner wall faces and the front face are side faces, the superconducting layer is formed to cover the front face of the base material and corner portions at which the front face contacts the respective inner wall faces. In addition, the superconducting layer may be formed to cover corner portions at which the front face contacts the side faces.

In the production method according to the above-described embodiment, the groove is preferably formed continuously from one end of the base material to the other end of the base material. Furthermore, the base material preparation process may include a substrate preparation process of preparing a substrate, and an intermediate layer formation process of forming an intermediate layer on a surface of the substrate. The cutting process of cutting completely through the base material along the groove may be carried out at least after the intermediate formation process.

Hereinafter, the superconductive conductor according to an embodiment of the invention, a method for producing the same, and a substrate for a superconductive conductor will be described in detail with reference to the attached drawings. In the drawings, members (constituent elements) having the same function or corresponding functions are designated by the same reference character, and description thereof may be omitted, as appropriate.

The method for producing a superconductive conductor according to the embodiment includes the following processes. However, the intermediate formation process and the following protective layer formation process described below may be omitted. Further, in the invention, the base material may consist of a substrate, or may have a structure in which an intermediate layer is formed on the substrate.

Substrate Preparation Process (Base Material Preparation Process 1)

This process is a process of preparing a substrate 10 (base material 100) having a groove 50 formed on at least one face thereof, as shown in FIG. 1A.

Intermediate Layer Formation Process (Base Material Preparation Process 2)

This process is a process of forming an intermediate layer 20 on a face of the substrate 10 at the side at which the groove 50 is formed, so as to form a base material 100, as shown in FIG. 1B.

Superconducting Layer Formation Process

This process is a process of forming a superconducting layer 30 on the intermediate layer 20, as shown in FIG. 1B.

Protective Layer Formation Process

This process is a process of forming a protective layer 40 on the superconducting layer 30, as shown in FIG. 1B.

Cutting Process

This process is a process of cutting completely through the base material 100 along the groove 50, as shown in FIG. 2A.

According to the production method of the above-described embodiment, a superconductive conductor according to that embodiment is obtained. As shown in FIG. 1B, the superconductive conductor according to the present embodiment includes, in the following order: a substrate 10 having a groove 50 on at least one face thereof; an intermediate layer 20 provided on a region, except the groove 50, of a face of the substrate 10 at a side at which the groove 50 is formed; and a superconducting layer 30 provided on the intermediate layer 20. Assuming that the superconducting layer 30 side face of the base material 100 is a front face, and that a face opposite to the front face is a rear face, and that the bottom of the groove 50 is a bottom face 50A, and that the faces of the groove 50 other than the bottom face 50A are inner wall faces 50B, and that the faces other than the rear face, the bottom face, the inner wall faces and the front face are side faces, the superconductive conductor according to the embodiment is configured such that the superconducting layer 30 covers the front face of the base material 100 (the substrate 10 and the intermediate layer 20), and such that corner covering portions 30A of the superconducting layer 30 respectively cover corner portions at which the front face contacts the respective side faces, and corner portions at which the front face contacts the respective inner wall faces 50B. Here, the intermediate layer 20 is also configured such that corner covering portions 20A thereof respectively cover corner portions at which the surface 10A of the substrate 10 contacts the respective inner wall faces 50B of the groove 50, and corner portions at which the surface contacts the respective side faces. In a case in which the corner covering portions 20A of the intermediate layer 20 are formed, the corner covering portions 30A of the superconducting layer 30 cover part of the corner covering portions 20A.

Although not described in the drawings, the corner covering portions 30A may be formed to partially cover the side faces and the inner wall faces 50B of the base material 100, and may be formed to entirely cover the side faces and inner wall faces 50B of the intermediate layer 20. Furthermore, a corner covering portion 30A may be formed to cover the inner wall face 50B of a groove 50. In an embodiment in which the superconducting layer 30 covers the side faces and inner wall faces 50B of the base material 100, the area covered may not be uniform in the longitudinal direction. Separation between plural layers constituting the base material 100 can be suppressed by the part of the superconducting layer 30. Further, in an embodiment in which the intermediate layer 20 and/or the protective layer 40 cover the side faces and inner wall faces of their corresponding underlying layers, there may be non-uniformity in the longitudinal direction, similar to the case of the superconducting layer 30.

Hereinafter, respective processes of the method for producing a superconductive conductor according to the present embodiment will be described.

(Substrate Preparation Process (Description of Substrate for Superconductive Conductor))

The shape of the substrate (substrate for a superconductive conductor) 10 may be any of various shapes such as a tape shape, a plate shape and a filamentous shape. For example, a high-strength alloy which contains Cu, Ni, Ti, Mo, Nb, Ta, W, Mn, Fe, Ag or the like, and which has material strength in terms of Hv hardness of more than 150, and which has excellent heat resistance, may be used as a material of the substrate 10. Stainless steel, HASTELLOY (registered trademark) and other Ni-based alloys, which have excellent corrosion resistance and excellent heat resistance, are particularly preferable. The substrate may be a material obtained by disposing any of various ceramics on any of various metallic materials such as those described above, or may be a ceramic alone.

Shape of Groove

Figure 4A:
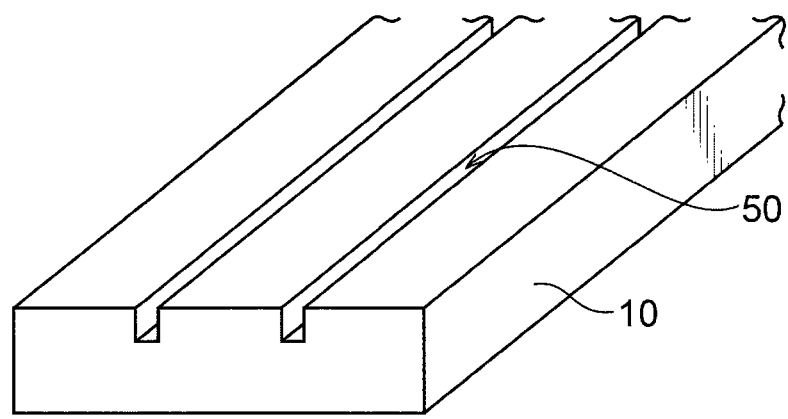
FIG. 4A is a perspective diagram illustrating a substrate having grooves that are continuously formed from one end to the other end.
Figure 4B:
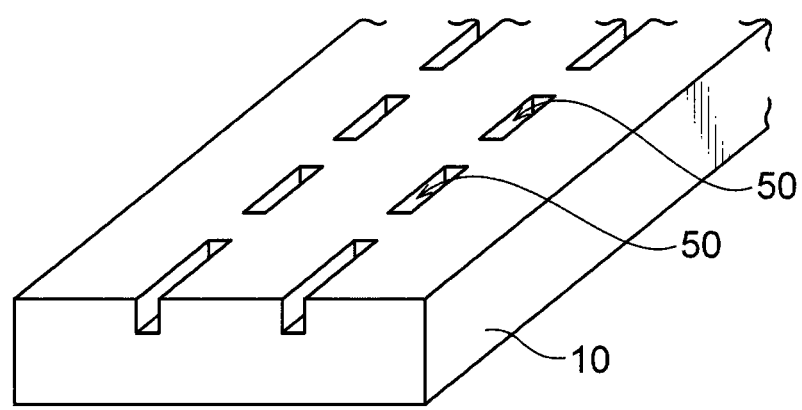
FIG. 4B is a perspective diagram illustrating a substrate having grooves that are discontinuously formed.

A groove 50 is formed on the substrate 10. As shown in FIGS. 4A and 4B, the groove 50 preferably has a shape extending in one direction. In the case of a long substrate, the groove more preferably has a shape extending in the longitudinal direction of the substrate. The cross-sectional shape of the groove 50 is not particularly limited, and may be appropriately chosen; examples of the shape include a square shape, a rectangular shape, a U shape, a V shape, an R shape, a trapezoidal shape, a rectangular shape, etc. Here, it is preferable that the area of opening of the groove 50 of the substrate 10 is not uniform in the depth direction, and that the area of opening of the groove 50 at a surface position of the substrate 10 (i.e., the area of opening of the uppermost region of the groove 50) is larger than the surface area of the bottom face 50A of the groove 50, and it is more preferable that the area of opening of the uppermost region of the groove 50 is the largest. By setting the area of opening of the uppermost region of the groove 50 to be larger than the surface area of the bottom face 50A, it becomes easier for a cutting means to enter the groove 50 in a case in which the substrate 10 is cut along the groove 50 from the superconducting layer 30 side, and it becomes easier for films (for example, the intermediate layer 20, the superconducting layer 30) formed on the substrate 10 to cover corner portions at which the surface 10A of the substrate 10 contacts the respective inner wall faces 50B of the groove 50.

The groove 50 may be continuously formed from one end of the substrate 10 to the other end of the substrate 10, as shown in FIG. 4A, or, alternatively, discontinuously formed, as shown in FIG. 4B. Furthermore, the groove 50 may be formed in an irregular repetitive arrangement or formed in pattern. However, in the case of producing plural superconductive conductors by cutting in the later-described cutting process, it is preferable to provide a groove 50 that is continuously formed from one end to the other end, as shown in FIG. 4A.

Depth of Groove

The depth of the groove 50 is preferably the same as or greater than the thickness of the superconducting layer 30, more preferably the same as or greater than the total thickness of the intermediate layer 20 and the superconducting layer 30, and still more preferably the same as or greater than the total thickness of the intermediate layer 20, the superconducting layer 30 and the protective layer 40.

When the intermediate layer 20, the superconducting layer 30 and the protective layer 40 are formed, a deposited matter is accumulated also on the bottom face 50A of the groove 50, and forms a deposited matter layer. However, with the depth of the groove 50 being the same as or greater than the thickness described above, electrical insulation between the superconducting layer 30 formed at portions other than the groove 50, and the deposited matter layer at the bottom face 50A of the groove 50 can more efficiently be accomplished.

The upper limit of the depth of the groove 50 is not limited as long as it is smaller than the thickness of the substrate 10, and is more preferably 50% or less of the thickness of the substrate 10 from the viewpoint of, for example, strength.

In a case in which the superconductive conductor consists of the base material 100 (the substrate 10 alone, or the substrate 10 and the intermediate layer 20) and the superconducting layer 30, the depth of the groove is preferably 50% or less of the thickness of the substrate 10, with a view to securing the strength. However, in the case of a superconductive conductor having the protective layer 40, the depth of the groove is more preferably from 0.1 to 50% of the thickness of the substrate 10, with a view to maintaining the connection between portions of the superconductive conductor other than the groove 50. Here, although the depth of the groove 50 is preferably constant in the longitudinal direction, the depth of the groove may vary in the longitudinal direction.

Surface Roughness Ra of Groove

The surface roughness Ra of the inner wall faces 50B of the groove 50 is preferably 0.02 µm or more, but more preferably 50 µm or less.

When the surface roughness Ra is the same as or smaller than the upper limit mentioned above, generation of an electric current path in the width direction due to abnormal discharge caused by projections on the inner wall faces 50B of the groove 50 can be suppressed. When the surface roughness Ra is the same as or greater than the lower limit mentioned above, orientation of the deposited matter layer on the inner wall faces 50B of the groove 50 generated during formation of the intermediate layer 20, the superconducting layer 30 and the protective layer 40 is suppressed, as a result of which the deposited matter layer in the groove 50 can be inhibited from acquiring superconducting properties.

The surface roughness Ra is preferably from 0.1 µm to 15 µm. When the Ra of the inner wall faces 50B of the groove 50 is 0.1 µm or more, orientation of the deposited matter layer in the groove 50 is suppressed, as a result of which the deposited matter layer can be inhibited from acquiring superconducting properties, and electric current paths in the width direction can be effectively suppressed. When the surface roughness Ra is 15 µm or less, the deposited matter layer is inhibited from acquiring superconducting properties, and, further, formation of macro-sized projections in the groove 50 and scattered presence of fine particles of deposited components inside the groove are suppressed, and contamination of the intermediate layer 20 due to scattering or adhesion of the fine particles of the deposited components is suppressed, as a result of which factors that destabilize the superconducting characteristics can be suppressed.

As in the case of the inner wall faces 50B, the surface roughness Ra of the bottom face 50A of the groove 50 is preferably 0.02 µm or more, but more preferably 50 µm or less. As in the case of the inner wall faces 50B, the surface roughness Ra of the bottom face 50A is more preferably from 0.1 µm to 15 µm. Control of the surface roughness Ra of the bottom face 50A carried out in the same manner as in the case of the inner wall face 50B further effectively suppresses electric current paths in the groove 50.

Surface Roughness Ra of Front Face and Side Faces of Substrate

In the substrate 10, the surface roughness Ra of the face 10A (except the inner wall faces of the groove 50) on which the intermediate layer 20 is to be formed is preferably less than 0.02 µm. When the surface roughness Ra is 0.02 µm or more, it is difficult to impart a desired orientation to the intermediate layer 20.

As in the case of the inner wall faces 50B, the surface roughness Ra of the side faces of the substrate 10 is preferably 0.02 µm or more, but more preferably 50 µm or less, and still more preferably from 0.1 µm to 15 µm. By controlling the surface roughness Ra of the side faces in the same manner as in the case of the inner wall faces 50B, both end portions of the substrate 10 in the width direction of the face 10A on which the intermediate layer 20 and the superconducting layer 30 are to be formed can be made to have the same multilayer configuration as each other, and the both end portions can be maintained to have equivalent separation suppressing effects.

Here, measurement of the surface roughness Ra may be carried out by the following method.

The surface roughness Ra is measured according to the method defined in Japanese Industrial Standards (JIS) B 0651-2001 using a stylus surface roughness measuring device.

However, in regard to the surface roughnesses Ra of the inner wall faces 50B and the bottom face 50A of the groove 50, in a case in which the groove 50 is formed using, for example, a grooving roll, the surface roughnesses Ra of portions of the grooving roll that correspond to the inner wall face positions and the bottom position, respectively, may be measured, and the obtained values may be regarded as the values of the surface roughnesses Ra of the inner wall faces 50B and the bottom face 50A, respectively.

In addition, the side faces of the substrate 10 may be shaped to have a desired surface roughness by, for example, an edger roll shaping or mechanical polishing.

Second Groove

As shown in FIG. 3, it is more preferable to use a substrate in which a second groove 52 is further formed on a face opposite to the face of the substrate 10 on a side on which the groove 50 is formed.

As shown in FIG. 3, the position at which the second groove 52 is formed may be a position that corresponds to the groove 50, or may be a position that does not correspond to the position of the groove 50, that is, a position that does not overlap the groove 50. Preferred shapes and preferred depth ranges of the second groove 52 are the same as those for the groove 50 described above. However, the combination of the shape and depth of the second groove 52 may be the same combination as that of the groove 50 provided on the opposite face of the substrate 10, or may be a combination different from that of the groove 50. The surface roughnesses Ra of inner wall faces 52B and a bottom face 52A of the second groove 52 are preferably, but not necessarily, the same as those of the inner wall faces 50B and the bottom face 50A of the groove 50, respectively.

In regard to the stage at which the second groove 52 is formed in the process of preparing the substrate 10, although the second groove 52 may be formed simultaneously with the formation of the first groove 50, the second groove 52 may be formed after the formation of the first groove 50, at a stage freely selected from the stages of after the formation of the intermediate layer 20, after the formation of the superconducting layer 30, and after the formation of the protective layer 40. The formation of the second groove 52 may be carried out plural times. From the viewpoint of suppressing a thickness variation generated at the time of formation of the second groove 52, the shape of the second groove 52 is preferably designed such that portions at which the surface of the rear face contacts the respective inner wall faces 50B that form the second groove 52 have a rounded shape.

In order to maintain the strength, the depth of the first groove 50 may be designed to be shallow (half the thickness of the substrate), layer formation may be carried out up to the formation of the protective layer 40, and the second groove 52 may be formed at a region of the rear face that corresponds to the first groove 50.

It is not necessary that the second groove 52 be formed after the formation of the first groove 50; therefore, the first groove 50 may be formed after formation of the second groove 52. Furthermore, a third groove that intersects with the second groove 52 may further be provided (though not shown in FIG. 3).

When the second groove 52 is provided on a face opposite to a side at which the groove 50 is provided, bending of the substrate 10 can be carried out in a more favorable manner. In particular, in a case in which the second groove 52 is provided at a position corresponding to the groove 50 as shown in FIG. 3, cutting along the groove 50 can be carried out in a more favorable manner.

The third groove that may be formed in the width direction (a direction that intersects with the second groove 52) of the superconductive conductor is formed to better fit the curvature of, for example, a winding frame, bobbin or former around which the superconductive conductor is to be wound. The third groove is preferably formed at at least one position in the longitudinal direction. It is not necessary that the third groove intersect with the second groove 52 at right angle; the third groove may be formed oblique to the longitudinal direction.

The formation of the first groove 50, the second groove 52 and the third groove enables provision of a superconductive conductor having favorable superconducting characteristics and excellent winding properties. Furthermore, in a case in which the third groove is formed oblique to the longitudinal direction, the superconductive conductor can be processed into a winding wire without deterioration of the superconducting layer 30.

In a case in which a cutting process of cutting along the groove 50 is included as described below, and the second groove 52 is formed on the substrate 10 at a position that corresponds to the groove 50, then the cutting is more preferably carried out from both of the groove 50 side and the second groove 52 side using laser cutting or cutting by slit processing.

Method for Forming Groove

A method for forming the groove 50 on the substrate 10 will be described with reference to an example.

First, a substrate 10 (for example, HASTELLOY (registered trademark, produced by Haynes International, Inc.), which is a nickel-based heat-resistant and corrosion-resistant alloy) having a desired width is subjected to cold rolling, to form a highly flat substrate surface. Then, the substrate is subjected to a process such as a mechanical or chemical polishing process, to be modified to have a substrate surface having still higher flatness. Further, grooves 50 corresponding to a desired width are formed on at least one face of the substrate 10 during the process of applying cold rolling to the substrate 10 (process that reduces the thickness from the plate thickness before rolling to the final plate thickness after rolling), or after the mechanical/chemical polishing process.

Examples of methods for forming the groove 50 include a method in which a groove shape is pressed into by using a grooving roll, thereby forming a continuous or discontinuous groove with a freely-chosen depth. The cross-sectional shape of the groove can be freely selected in accordance with the grooving roll. The thickness of the finished substrate 10 is, for example, from 50 μm to 200 μm. A groove depth corresponding to from 5% to 30% of a 100 μm thickness, for example, is preferable, and a groove depth corresponding to from 10% to 20% of a 100 μm thickness is more preferable. The width of the opening of the groove is preferably from 0.1 mm to 3 mm, and more preferably 1 mm or more. The width of the opening may be freely set.

In a case in which the intermediate layer 20 and the superconducting layer 30 are disposed on the surface 10A of the substrate 10, the intermediate layer 20 and the superconducting layer 30 in the groove 50 portion are disposed along a corner formed on the substrate 10, whereby separation between the stacked layers respectively forming the intermediate layer 20, the superconducting layer 30, etc. can be suppressed.

Lasers may be used as a method for forming the groove 50. In the case of using a laser, the groove 50 corresponding to a desired width is formed on at least one face of the substrate 10 during the process of cold rolling the substrate 10, or after the process of mechanical/chemical polishing of the substrate 10, as in the case of grooving by the grooving roll. In addition, it is more preferable that the groove be formed by a laser at the final thickness of the rolled plate of the cold rolling processes.

At a position at which a groove is formed using a grooving roll, groove formation may be carried out again using a laser. Alternatively, formation of a groove using a grooving roll and groove formation using a laser may alternately be carried out. The grooving roll has a grooving effect and an effect of shaping and flattening the inside of the groove.

The width of the opening of the groove formed using a laser may be freely set, and is preferably from 0.02 to 3 mm.

Further, the formation of the second groove 52 and the third groove may be carried out in accordance with the method for forming the groove 50.

(Intermediate Layer Formation Process)

The intermediate layer 20 is a layer that is formed on the substrate 10 in order to realize high in-plane orientation of the superconducting layer 30. The intermediate layer 20 has physical characteristic values, such as coefficient of thermal expansion and lattice constant, that are intermediate between those of the substrate 10 and those of the oxide superconductor constituting the superconducting layer 30.

The intermediate layer 20 may be a single layer or multiple layers having two or more layers. An example of the intermediate layer 20 has a bed layer, a biaxially oriented layer and a cap layer.

Bed Layer

Examples of a constituent material of the bed layer 22 include $Gd_2Zr_2O_{7-\delta}$ ($-1<\delta<1$, hereinafter referred to as GZO), $YAlO_3$ (yttrium aluminate), YSZ (yttria protected zirconia), $Y_2O_3$, $Gd_2O_3$, $Al_2O_3$, $B_2O_3$, $Sc_2O_3$, REZrO, $RE_2O_3$, etc., and, among these, GZO, $Y_2O_3$ and YSZ are favorable. Here, RE represents a single rare-earth element or plural rare-earth elements. The bed layer 22 may have a function, such as improvement of biaxial orientation. It is preferable to use GZO as a constituent material of the bed layer 22, in a case in which the bed layer 22 is provided with the function of improving biaxial orientation.

The film thickness of the bed layer 22 is not particularly limited, and is, for example, from 10 nm to 200 nm.

Examples of methods for forming (film-forming) the bed layer 22 include a method of forming the bed layer 22 by an RF sputtering method under an argon atmosphere.

In the RF sputtering method, an inert gas ion (for example, $Ar^+$) that is generated by plasma discharge is collided with a deposition source (for example, GZO), and the sputtered particles to be deposited are allowed to deposit on a film-formation surface, as a result of which a film is formed. Film formation conditions therefor are set, as appropriate, in accordance with the constituent material, film thickness, etc. of the bed layer 22, and the film formation may be carried out, for example, with an RF sputtering output of from 100 W to 500 W, a substrate conveyance speed of from 10 m/h to 100 m/h and a film formation temperature of from 20° C. to 500° C.

For the formation of the bed layer 22, an ion beam sputtering method in which ions generated by an ion generator (an ion gun) are collided with a deposition source may be employed. The bed layer 22 may have a multilayer structure such as a combination of a $Y_2O_3$ layer and an $Al_2O_3$ layer.

Biaxially Oriented Layer

A biaxially oriented layer 24 is formed on the bed layer 22, and is a layer for orienting a crystal of the superconducting layer 30 in certain directions.

Examples of a constituent material of the biaxially oriented layer 24 include polycrystalline materials such as MgO, $CeO_2$, YSZ and NbO. Among these, it is preferable to contain MgO.

The film thickness of the biaxially oriented layer 24 is not particularly limited, and is, for example, from 1 nm to 20 nm.

A preferable method for forming (film-forming) the biaxially oriented layer 24 is a method in which target particles are sputtered from a target (a deposition source) using a sputtering method, and in which the sputtered target particles are allowed to form a layer on the bed layer 22 is preferable. A layer deposition method using a sputtering method in which, while an ion beam is irradiated to a film formation face from an oblique direction, target particles from a target are allowed to deposit on the film formation face so as to form a film (IBAD: Ion Beam Assisted deposition) is particularly preferable.

Conditions for the film formation are set, as appropriate, in accordance with the constituent material, film thickness, etc. of the biaxially oriented layer 24, and are preferably, for example, the following conditions.

IBAD Assisted Ion Beam Voltage: from 800 V to 1,500 V
IBAD Assisted Ion Beam Current: from 80 mA to 350 mA
IBAD Assisted Ion Beam Acceleration Voltage: 200 V RF sputtering output: from 800 W to 1,500 W
Substrate Conveyance Speed: from 80 m/h to 500 m/h
Film Formation Temperature: from 5° C. to 250° C.
Cap Layer In the present embodiment, a cap layer may further be provided on the biaxially oriented layer 24. The cap layer is formed on the biaxially oriented layer 24, and is a layer for protecting the biaxially oriented layer 24 and for increasing the lattice matching with the superconducting layer 30.

Examples of a material of the cap layer include $LaMnO_3$ (LMO), $CeO_2$, MgO, YSZ, $SrTiO_3$ (STO), etc.

The cap layer may be a single layer or may be composed of plural (two or more) layers as shown in FIG. 1B. FIG. 1B shows a cap layer composed of a first cap layer 26 and a second cap layer 28, which may be, for example, a combination of a first cap layer 26 formed by a sputtering method and made of LMO, and a second cap layer 28 formed by a sputtering method and made of $CeO_2$.

The film thickness of the cap layer is not particularly limited, and is preferably 50 nm or more, and more preferably 300 nm or more, from the viewpoint of obtaining sufficient orientation.

Examples of methods for forming (film-forming) the cap layer include film formation by a PLD method and film formation by an RF (radio frequency) sputtering method. Conditions for film formation by the RF sputtering method are set, as appropriate, in accordance with the constituent material, film thickness, etc. of the cap layer, and are preferably, for example, the following conditions.

RF Sputtering Output: from 400 W to 1,000 W
Substrate Conveyance Speed: from 2 m/h to 50 m/h
Film Formation Temperature: from 450° C. to 800° C.
(Superconducting Layer Formation Process)

The superconducting layer 30 is formed on the intermediate layer 20, and is preferably constituted by an oxide superconductor, particularly, a copper oxide superconductor. A crystalline material represented by a compositional formula of, for example, $REBa_2Cu_3O_{7-\delta}$ (referred to as RE-123) may be used as the copper oxide superconductor.

In $REBa_2Cu_3O_{7-\delta}$, RE represents a single rare-earth element such as Y, Nd, Sm, Eu, Gd, Dy, Ho, Er, Tm, Yb or Lu, or plural rare-earth elements. Among these, Y is often used. Further, $\delta$ represents a non-stoichiometric oxygen amount, and is, for example, from 0 to 1, and a value of $\delta$ close to 0 is more preferable from the viewpoint of provision of a higher superconducting transition temperature.

The film thickness of the superconducting layer 30 is not particularly limited, and is, for example, from 0.8 μm to 10 μm.

Examples of methods for forming (film-forming) the superconducting layer 30 include a TFA-MOD method, a PLD method, a CVD method, an MOCVD method, a sputtering method, etc. Among these film forming methods, it is preferable to use the MOCVD method for the reason that the MOCVD method does not require high vacuum, facilitates formation of a large-area film, and is highly suitable for mass production. Conditions for film formation in the case of using the MOCVD method are set, as appropriate, in accordance with the constituent material, film thickness, etc. of the superconducting layer 30, and are preferably, for example, the following conditions.

Substrate Conveyance Speed: from 80 to 500 m/h
Film Formation Temperature: from 800 to 900° C.

Further, the film formation is preferably carried out under an oxygen gas atmosphere, from the viewpoint of decreasing the non-stoichiometric oxygen amount $\delta$ and thereby increasing the superconducting characteristics.

(Protective Layer Formation Process)

A protective layer (stabilization layer) 40 made of silver may be formed on the upper face of the superconducting layer 30 described above using, for example, a sputtering method. Further, after the superconductive conductor is produced by forming the protective layer 40, the superconductive conductor may be subjected to heat treatment.

In order to form the protective layer 40 in such a manner that corner portions of the superconducting layer 30 are covered with corner covering portions 40A, a method of forming the protective layer using the following method may be employed.

In a method in which target particles (silver particles) are sputtered from a target (a deposition source) using a sputtering method, and the sputtered target particles are allowed to form a layer on the substrate 10 on which the superconducting layer 30 has already been formed, the target particles may be irradiated from the direction normal to the surface of the superconducting layer 30 over a region wider than the width of the superconducting layer 30, and are allowed to deposit, whereby a protective layer 40 with its corner covering portions 40A covering the corners of the superconducting layer 30 can be formed. It is also possible to form a covering portion made of silver at the deepest portions of side faces of the groove 50, by adjusting the angle of irradiation onto the surface of the superconducting layer 30 by increasing or decreasing the angle in the width direction, relative to the normal direction. These are also effective in multi-turn methods.

As described above, a deposited matter is accumulated also on the bottom face 50A of the groove 50 during formation of the intermediate layer 20, the superconducting layer 30 and the protective layer 40. However, when the groove 50 is sufficiently deep, the deposited matter layer made of the deposited matter is in a state of being electrically insulated from the superconducting layer 30. In a case in which the deposited matter layer is electrically connected to the superconducting layer 30, the deposited matter layer may afterwards be removed using a grooving roll or the like after the formation of the protective layer 40. The removal of the deposited matter layer may alternatively be carried out by subjecting the inside of the groove 50 to mechanical polishing, chemical treatment or the like. The removal of the deposit matter layer may alternatively be carried out by a combination of the removal method using a grooving roll or the like, and the removal method using mechanical polishing, chemical treatment or the like.

(Cutting Process)

In the method for producing a superconductive conductor according to the present embodiment, it is preferable that the groove is continuously formed from one end of the substrate to the other end of the substrate. In addition, the cutting process is preferably a process of cutting completely through the substrate 10 along the groove 50 at least after the intermediate layer formation process.

In the cutting process, cutting is carried out along the groove 50 using a cutting method that employs a laser or a cutting method that employs slit processing. For example, in a case in which cutting is carried out at a continuous groove 50 portion as shown in FIG. 4A, cutting is preferably carried out along the longitudinal direction of the groove 50. In a case in which cutting is carried out at discontinuous groove 50 portions as shown in FIG. 4B, cutting is preferably carried out along the direction in which plural grooves 50 are arranged. That is, superconductive conductors having a desired width can be formed by forming grooves 50 with the desired interval therebetween. However, with respect to the range of cutting in the longitudinal direction, cutting is not limited to cutting at the same groove positions and the same directional positions from one end of the base material to the other end of the base material, and cutting may alternatively be continuous cutting from one end of the base material to the other end of the base material.

Since cutting can be carried out without giving large thermal hysteresis to the superconducting layer 30 of the superconductive conductor after thinning, deterioration in the superconducting characteristics of end portions of the superconducting layer 30 of the thinned superconductive conductor can be suppressed.

In a case in which the second groove 52 is further formed at a position corresponding to the groove 50, on a face of the substrate 10 at a side opposite to a face at which the groove 50 is formed, it is more preferable to perform cutting using a laser or cutting using slit processing from both the groove 50 side and the second groove 52 side.

Since the groove 50 and the second groove 52 are located at corresponding positions, the thinned superconductive conductor (the substrate 10, the intermediate layer 20, the superconducting layer 30 and the protective layer 40) hardly exhibits a change in thickness due to cutting at the groove 50-groove 52 position, and, therefore, high accuracy dimensions are ensured.

The cutting process is carried out preferably after at least the intermediate layer formation process is carried out, more preferably after the superconducting layer formation process is carried out, and particularly preferably after the protective layer 40 is formed. After performing the cutting process, the superconductive conductor may be coated with a stabilization layer such as a Cu layer. Even in a case in which a stabilization layer is formed by plating, it can easily be ensured that the thickness of the superconductive conductor covered with the stabilization layer is uniform; this is because, since the groove 50 and the second groove 52 are located at corresponding positions, and the cutting is carried out at the groove 50-groove 52 portion, the dimensions of the thinned superconductive conductor are secured.

The cutting process may be carried out after the formation of the stabilization layer such as a Cu layer.

Figure 2B:
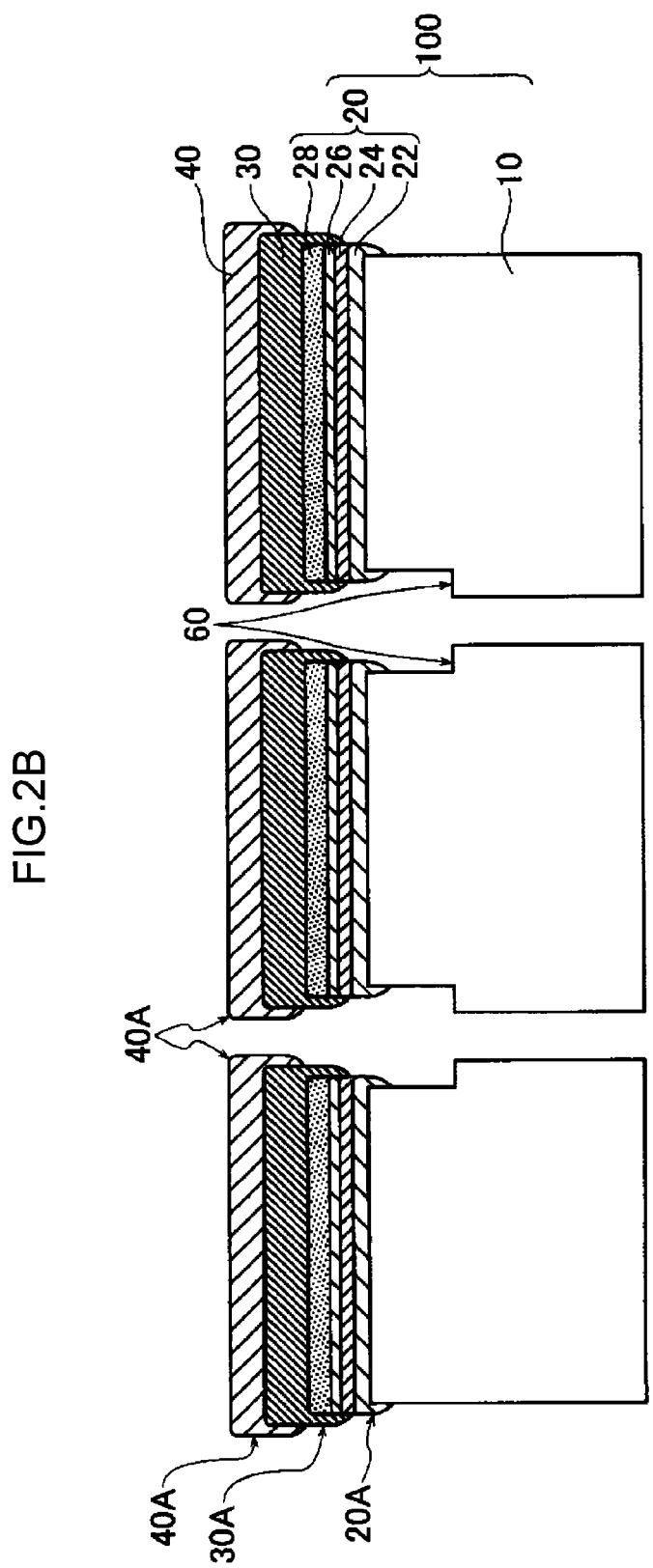
FIG. 2B is a schematic cross-sectional diagram illustrating a stage in a cutting process in a production method according to the invention.

In the superconductive conductor prepared according to the production method of the present embodiment, a trace 60, which is a trace of the bottom face 50A of the groove 50, is left at a position of the base material 100 that corresponds to a position at which the groove 50 was present, as shown in FIG. 2B. Besides the trace 60, in some cases, a trace of a shear fracture face or a laser welding trace are left in a region of the base material 100 that ranges from the bottom face 50A of the groove 50 to the rear face (the side at which the intermediate layer 20 and the superconducting layer 30 are not formed). These traces can be suppressed by appropriately determining the cutting direction for the cutting. Further, the trace 60 can be removed using a laser, so as to form a flat cut face having no protrusion. In this case, since the removal of the trace 60 is carried out on a side opposite to the superconducting layer 30, thermal hysteresis gives only a small influence to the superconducting layer 30.

In the case of winding the superconductive conductor, it is effective to allow the trace 60 to be left in the superconductive conductor. This is because the trace 60 has an effect in terms of fixing the movement between adjacent superconductive conductors. Further, in a case in which an insulation material is wound around the superconductive conductor, the trace 60 also has an effect in terms of suppressing the sliding of the insulation material. The trace 60 may be left on only one of the two cut faces of the thinned superconductive conductor.

<Usage Manner of Superconductive Conductor>

In the embodiment described above, a superconductive conductor having a superconducting layer 30 divided into plural portions provided on one substrate 10, as shown in FIG. 1B, can be produced by leaving some of grooves 50 as they are instead of carrying out cutting along all of the grooves 50 in the cutting process.

The superconductive conductor having a superconducting layer 30 divided into plural portions provided on one substrate 10 as shown in FIG. 1B may be produced by a production method that does not include a cutting process, specifically, by a production method having a substrate preparation process and a superconducting layer formation process (and may further have an intermediate layer formation process or a protective formation process, if necessary).

The superconductive conductor as shown in FIG. 1B can be used, for example, in such a manner that the superconductive conductor bent in the width direction at the groove portions is disposed on an outer circumferential surface of a cylindrical object along the long-axis direction thereof.

Figure 7:
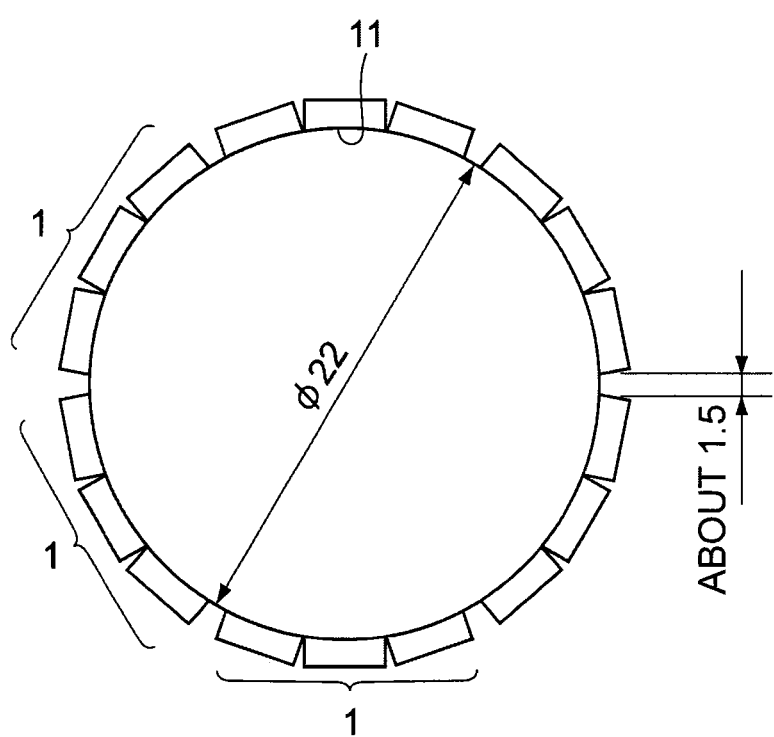
FIG. 7 is a diagram illustrating an embodiment in which a superconductive conductor is bent to be disposed on the outer circumferential surface of a cylindrically-shaped object.

FIG. 7 shows a cross-sectional diagram illustrating a plurality of the superconductive conductor 1 (six in number in FIG. 7, width: 10 mm) that are bent at the portions of the grooves, that are wound in a spiral shape (spirally wound) around the outer circumferential surface of a cylindrical copper object 11 having a diameter of 22 mm. The gap (predetermined distance) between superconductive conductors 1 is approximately 1.5 mm. Two grooves 50 as shown in FIG. 1B are formed on each of the superconductive conductors 1.

Each of the grooves 50 may be a groove that is continuously formed from one end of the base material 100 to the other end of the base material 100 as shown in FIG. 4A, or a groove that is discontinuously formed as shown in FIG. 4B. When a second groove 52 as shown in FIG. 3 is provided on a face of the base material 100 at a side opposite to a side at which the groove 50 is formed, spiral winding can be carried out more easily under tension, in a shape close to a true circle along a radius of curvature R of the cylindrical object 11, with no effect of bending strain applied to the superconducting layer 30.

In a case in which a groove 50 is discontinuously formed as shown in FIG. 4B, a cut that penetrates through the base material 100 may be made at the groove 50 portion. As a result of making the cut, the shape of the thinned superconductive conductors 1 can be maintained without separation, and spiral winding around the cylindrical object 11 can be carried out more easily. The cut may be made using a laser or the like.

In the embodiment described above, in a case in which the superconductive conductors are obtained by cutting along all of the grooves 50 portions in the cutting process, the superconductive conductors may be superconductive conductors that are thinned to have a desired width, and can highly suitably be used for superconducting cables, superconducting magnets, etc.

(Modification Example)

Although specific embodiments of the invention are described above in detail, the invention is not limited to such embodiments, and it will be apparent to a person having ordinary skill in the art that various different embodiments are possible within the scope of the invention. For example, two or more of the embodiments described above may be combined, as appropriate, and practiced. In addition, the following modification examples may also be combined, as appropriate.

For example, the intermediate layer 20 may be constituted by one layer, or may further have one or more other layers.

Although a case in which the non-stoichiometric oxygen amount δ of $YBa_2Cu_3O_{7-\delta}$ or the like is 0 or more (a case in which δ represents a positive value), δ may alternatively represent a negative value.

Advantageous Effects

Figure 5A:
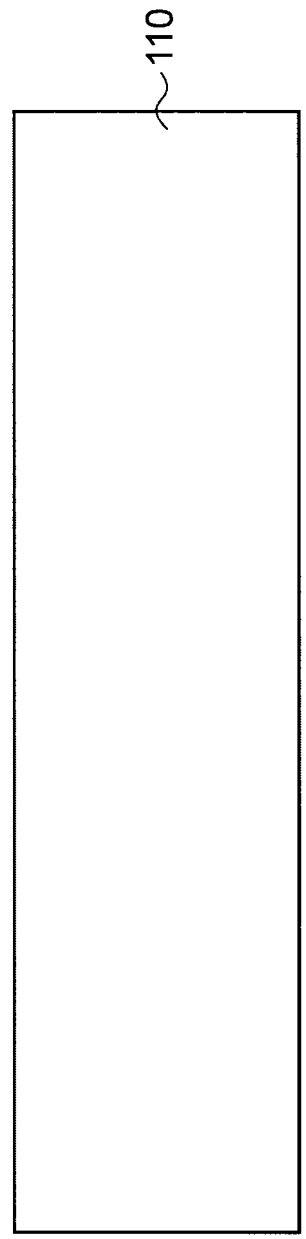
FIG. 5A is a schematic cross-sectional diagram illustrating a production process in a conventional production method.
Figure 5B:
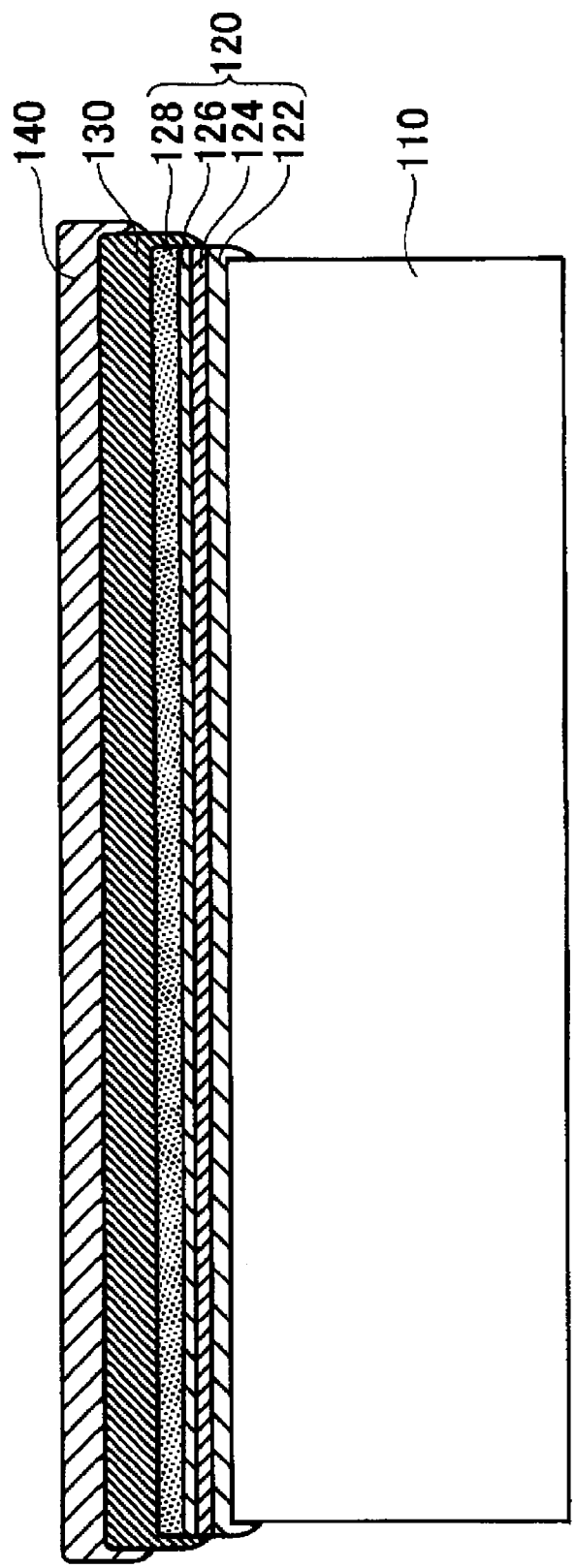
FIG. 5B is a schematic cross-sectional diagram illustrating a production process in a conventional production method.

In conventional preparation of a superconductive conductor having a desired width, first, on a substrate 110 shown in FIG. 5A, an intermediate layer 120 including a bed layer 122, a biaxially oriented layer 124, a first cap layer 126, a second cap layer 128 and the like, and a superconducting layer 130, a protective layer 140 and the like were formed as shown in FIG. 5B. Then, the protective layer 140, the superconducting layer 130, the intermediate layer 120 and the substrate 110 were cut completely through the positions indicated by an arrow shown in FIG. 6A, using a cutting method using a laser or a cutting method using slit processing, as a result of which a superconductive conductor having a desired width as shown in FIG. 6B was obtained.

However, the method of cutting using a laser had a problem in that the superconducting characteristics were deteriorated by heat generation accompanying laser irradiation conducted in the processing. Specifically, fusion cutting traces are generated on a laser-cut face due to heat generation, and the shape of the cut face is non-uniform. In this process, the heat generated by the laser irradiation causes an adverse effect on the superconducting characteristics, and, in a case in which a stabilization layer made of, for example, copper plating is further formed after the laser cutting, the fusion cutting traces on the cut face may cause an unstable shape of the resultant stabilization layer. As a result, there were problems in terms of the deterioration of the superconducting characteristics and deterioration of the insulation characteristics of the superconductive conductor.

Further, in a case in which the fusion cutting traces had protruding shapes, an apparent size of the superconductive conductor was increased, and, in the case of processing into a wound wire or the like for a device, there were problems in that the electric current density through the device was decreased. In addition, since the dimensional accuracy of the superconductive conductor in the device was low, non-uniform stress was applied to the superconducting layer of the superconductive conductor, thereby causing deterioration of the superconducting characteristics. Furthermore, in a case in which the superconductive conductor is formed into a coil for a magnet, the inferior dimensional accuracy of the superconductive conductor may cause movement of the superconductive conductor during excitation, which may cause magnet quenching. As described above, there were problems in terms of influences on the long-term stability of the device.

Since the superconducting layer of the superconductive conductor after the thinning treatment using a laser experienced a large thermal hysteresis, superconducting characteristics (threshold current characteristics) at end portions of the superconducting layer 30, which were cut portions, were deteriorated. In addition, the laser cutting raised a problem in that separation between the layers of the intermediate layer and the superconducting layer that were disposed on the substrate was facilitated.

In the cutting method using slit processing, since a shearing force applied in the cutting is directly applied to the superconducting layer, there was a problem in that the superconducting characteristics were deteriorated. In addition, in regard to the shape of the cut portion, similarly to the fusion cutting traces generated by laser cutting, protruding traces (so-called burr) were generated due to shearing at the cut portion, and the shape of the cut face was non-uniform. In a case in which a stabilization layer made of, for example, copper plating is further formed after the cutting using slit processing, the protruding traces may cause an unstable shape of the resultant stabilization layer. As a result, similarly to the case of laser cutting, there were problems such as the deterioration of the superconducting characteristics, deterioration of the insulation characteristics of the superconductive conductor and separation between the stacked layers.

In addition, a cutting method using a laser or the like was similarly employed also in a case in which only the layers disposed on the substrate, such as a protective layer, a superconducting layer and an intermediate layer, were cut to form a superconductive conductor having a superconducting layer divided into plural pieces on one substrate, as shown in FIG. 6B, rather than performing the cutting through to the substrate 110. Accordingly, there were the problem of the generation of fusion cutting traces described above and the problem accompanying the generation of fusion cutting traces.

In contrast, in the case of using a process in which some of the grooves 50 are left as they are, rather than performing cutting along all of the grooves 50, in the cutting process of the production method according to the invention, as shown in FIG. 1B, the intermediate layer 20, the superconducting layer 30, etc. are disposed on the substrate 10 on which the grooves 50 have been formed in advance as shown in FIG. 1A; therefore, a superconductive conductor in which a superconducting layer 30 divided into plural pieces is provided on one substrate 10 can be formed without cutting the superconducting layer 30. Specifically, occurrence of the fusion cutting traces in the case of using a laser, protruding traces in the case of using slit processing, etc. are suppressed, non-uniformity in the shape can be suppressed, and a decrease in the superconducting characteristics of the superconductive conductor can be suppressed.

In the case of further forming the protective layer 40 in the production method of the invention, since the protective layer 40 is formed such that the corners at which the surface of the superconducting layer 30 contacts the respective side faces of the superconducting layer 30 are covered with corner covering portions 40A as shown in FIG. 1B, the side faces of the superconducting layer 30 can also be protected by the protective layer 40, which contrasts with the conventional examples in which the corner covering portions 40A are not formed on the cut faces. Further, layer separation between the stacked layers (between the superconducting layer 30 and the intermediate layer 20 or between the sub-layers of the intermediate layer 20) on side faces of divisional portions separated by the groove 50 can be suppressed.

According to the production method of the invention, separation of superconductive conductors can be achieved by cutting completely through the substrate 10 along the groove 50 as shown in FIG. 2B. Therefore, generation of fusion cutting traces, protruding traces, etc. at the intermediate layer 20, the superconducting layer 30, the protective layer 40, etc., which are formed at portions other than the groove 50, is suppressed, non-uniformity of the shape is suppressed, and a decrease in the superconducting characteristics of the superconductive conductor can be suppressed. Specifically, even in the case of cutting using a laser, heat generation accompanying the laser irradiation does not affect the superconducting layer 30 etc., and a superconductive conductor in which a decrease in the superconducting characteristics is suppressed can be obtained. Also in the case of slit processing, since an influence of the shearing force on the superconducting layer 30 etc. at the time of cutting can be minimized, a superconductive conductor in which a decrease in the superconducting characteristics is suppressed can be obtained.

In the case of further forming the protective layer 40 in the production method of the invention, since the protective layer 40 is formed such that the corners at which the surface of the superconducting layer 30 contacts the respective side faces of the superconducting layer 30 are covered with corner covering portions 40A as shown in FIG. 2B, the side faces of the superconducting layer 30 can also be protected by the protective layer 40, which contrasts with the conventional examples in which the corner covering portions 40A are not formed on the cut face. Further, layer separation between the stacked layers (between the superconducting layer 30 and the intermediate layer 20 or between the sub-layers of the intermediate layer 20) at side faces of divisional portions separated by the groove 50 can be suppressed.

The disclosure of Japanese Patent Application No. 2011-169608 is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

EXAMPLES

Hereinafter, examples and comparative examples will be described, but the invention is not limited to the following examples.

Example 1

(Base Material)

A low-magnetic non-oriented metallic tape base material (HASTELLOY (registered trademark, produced by Haynes International, Inc.), which is a nickel-based heat-resistant and corrosion-resistant alloy) was prepared. This material had a shape of 0.25 mm in thickness×75 mm in width. The tape base material was processed into a tape base material of 0.2 mm in thickness×75 mm in width×550 m, using a 12-stage rolling machine having a roll diameter $\phi$ of 20 mm.

Next, U-shaped grooves each having a groove depth of 50 μm×a groove opening width of 1 mm were formed using a grooving roll, and cold rolling was also carried out. Seven lines of U-shaped grooves were arranged with a pitch of 10 mm in the width direction, and were shaped to extend parallel to each other in the longitudinal direction. Then, cold rolling was continued, as a result of which a tape base material of 0.1 mm in thickness×75 mm in width having seven grooves was produced. The groove depth of the resultant tape base material was 25 μm, the opening width at the upper portion of each groove was 1 mm, and the width at the lowest portion of each groove was 0.7 mm. The groove width ratio between the uppermost portion and lowermost portion of the groove was approximately 1.42.

In the latter stage of the process of cold rolling, a shaping processing of the inside of each groove was carried out using a grooving roll. The surface roughness Ra of the bottom of each groove was 0.05 μm.

Then, TA (tension annealing treatment) was carried out with a view to improving the shape, whereby a flat metallic substrate was obtained. Thereafter, the surface of the metallic tape base material was finished to a surface roughness Ra of 0.0011 μm by mechanical polishing.

(GZO Layer)

Then, $Gd_2Zr_2O_7$ (GZO) layer (film thickness: 110 nm) was formed on a surface of the metallic tape base material, which had been finished to a surface roughness Ra of 0.0011 μm, by an ion beam sputtering method at room temperature.

(IBAD-MgO Layer, LMO Layer, $CeO_2$ Layer)

Furthermore, an MgO layer (film thickness: from 3 nm to 5 nm) was formed by an IBAD method at from 200 to 300° C., and then an $LaMnO_3$ layer (film thickness: 30 nm) was formed by an RF sputtering method at from 600 to 700° C. Furthermore, a $CeO_2$ layer (film thickness: 400 nm) was formed by the RF sputtering method at from 500 to 600° C.

(Superconducting Layer)

Then, a $YG_dBa_2Cu_3O_{7-d}$ superconducting layer was formed in a thickness of 1 μm, using an MOCVD method under a condition of 800° C.

(Protective Layer)

An Ag layer as a protective layer was formed, in a thickness of 15 μm, on the superconducting layer obtained as described above.

(Cutting)

A slit processing method was carried out at positions of the grooves on the surface of the tape base material, thereby cutting to form 6 strips of superconducting wire material each having a width of 10 mm and a length of 500 m. Furthermore, oxygen annealing was carried out under an oxygen flow atmosphere at 550° C., as a result of which a superconducting wire material was obtained.

The 6 strips of the superconductor wire material produced, each having a length of 500 m, were measured with respect to threshold current (Ic) in a state of being immersed in liquid nitrogen using the four-terminal method. The measurement was carried out with a pitch of 1 m, and the distance between voltage terminals was set to 1.2 m. Electrical conduction characteristics of the superconducting wire material were measured with a definition of 1 μV/cm.

A threshold current (Ic) of 290 A or more was confirmed at all measurement positions.

Example 2

(Base Material)

A low-magnetic non-oriented metallic tape base material (HASTELLOY (registered trademark, produced by Haynes International, Inc.), which is a nickel-based heat-resistant and corrosion-resistant alloy) was prepared. This material had a shape of 0.25 mm in thickness×30 mm in width. The tape base material was processed into a tape base material having 0.2 mm in thickness×30 mm in width×250 m, using a 12-stage rolling machine having a roll diameter $\phi$ of 20 mm.

Next, V-shaped grooves each having a groove depth of 50 μm×a groove opening width of 1 mm were formed using a grooving roll, and cold rolling was also carried out. Six lines of V-shaped grooves were arranged with a pitch of 4 mm in the width direction, and were shaped to extend parallel to each other in the longitudinal direction. Then, cold rolling was continued, as a result of which a tape base material of 0.1 mm in thickness×30 mm in width having six grooves was produced. The groove depth of the resultant tape base material was 25 μm, and the width of the opening at the top of each groove was 1 mm.

In the latter stage of the process of cold rolling, a shaping processing of the inside of each groove was carried out using a grooving roll. The surface roughness Ra of the bottom of each groove was 0.045 μm.

Then, TA (tension annealing treatment) was carried out with a view to improving the shape, whereby a flat metallic substrate was obtained. Thereafter, the surface of the metallic tape base material was finished to a surface roughness Ra of 0.001 μm by mechanical polishing.

A GZO layer, an IBAD-MgO layer, a LMO layer, a CeO$_2$ layer, a superconducting layer and a protective layer were formed according to the method described in Example 1.

Cutting

A slit processing method was carried out at positions of the grooves on the surface of the tape base material, thereby cutting to form 5 strips of superconducting wire material each having a width of 4 mm and a length of 250 m. Furthermore, oxygen annealing was carried out under an oxygen flow atmosphere at 550° C., as a result of which a superconducting wire material was obtained.

5 strips of the super conductor wire material produced, each having a length of 200 m, were measured with respect to threshold current (Ic) in a state of being immersed in liquid nitrogen using the four-terminal method. The measurement was carried out with a pitch of 1 m, and the distance between voltage terminals was set to 1.2 m. Electrical conduction characteristics of the superconducting wire material were measured with a definition of 1 μV/cm.

A threshold current (Ic) of 96 A or more was confirmed at all measurement positions.

Example 3

(Base Material)

A low-magnetic non-oriented metallic tape base material (HASTELLOY (registered trademark, produced by Haynes International, Inc.), which is a nickel-based heat-resistant and corrosion-resistant alloy) was prepared. This material had a shape of 0.25 mm in thickness×35 mm in width. The tape base material was processed into a tape base material of 0.2 mm in thickness×35 mm in width×250 m, using a 12-stage rolling machine having a roll diameter φ of 20 mm.

Next, V-shaped grooves each having a groove depth of 50 μm×a groove opening width of 0.5 mm were formed using a grooving roll, and cold rolling was also carried out. 13 lines of V-shaped grooves were arranged with a pitch of 2 mm in the width direction, and were shaped to extend parallel to each other in the longitudinal direction. Then, cold rolling was continued, as a result of which a tape base material of 0.1 mm in thickness×35 mm in width having 13 grooves were produced. The groove depth of the resultant tape base material was 25 μm, and the width of the opening at the top of each groove was 0.5 mm.

In the latter stage of the process of cold rolling, a shaping processing of the inside of each groove was carried out using a grooving roll. The surface roughness Ra of the bottom of each groove was 0.05 μm.

Then, TA (tension annealing treatment) was carried out with a view to improving the shape, whereby a flat metallic substrate was obtained. Thereafter, the surface of the metallic tape base material was finished to a surface roughness Ra of 0.0012 μm by mechanical polishing.

A GZO layer, an IBAD-MgO layer, a LMO layer, a CeO$_2$ layer, a superconducting layer and a protective layer were formed according to the method described in Example 1.

Cutting

A slit processing method was carried out at positions of the grooves on the surface of the tape base material, thereby cutting to form 3 strips of a superconducting wire material each having a width of 8 mm and a length of 250 m. The resultant 8 mm-wide tape base material had preformed grooves (some of the 13 grooves described above) with a pitch of 2 mm that divided the width direction into four portions. The grooves with a pitch of 2 mm were formed in parallel to each other in the longitudinal direction, and the inner faces of each groove were formed flat with a uniform flatness and being free of protruding shapes. Therefore, the grooves are considered to have an effect of electrically insulating each portion of the superconducting layer from each other.

Furthermore, oxygen annealing was carried out under an oxygen flow atmosphere at 550° C., as a result of which a superconducting wire material was obtained.

A part of the produced superconductor wire material that had a length of 200 m were measured with respect to threshold current (Ic) in a state of being immersed in liquid nitrogen using the four-terminal method. The measurement was carried out with a pitch of 1 m, and the distance between voltage terminals was set to 1.2 m. Electrical conduction characteristics of the superconducting wire material were measured with a definition of 1 μV/cm.

A threshold current (Ic) of 192 A or more was confirmed at all measurement positions. In addition, with a measurement at a width pitch of 2 mm, 48 A or more was confirmed at each of the 2 mm-width measurement points on each strip.

Comparative Example 1

(Base Material)

A low-magnetic non-oriented metallic tape base material (HASTELLOY (registered trademark, produced by Haynes International, Inc.), which is a nickel-based heat-resistant and corrosion-resistant alloy) was prepared. This material had a shape of 0.25 mm in thickness×30 mm in width. The tape base material was processed into a tape base material of 0.1 mm in thickness×30 mm in width×250 m, using a 12-stage rolling machine having a roll diameter φ of 20 mm.

Next, TA (a tension annealing treatment) was carried out with a view to improving the shape, whereby a flat metallic substrate was obtained. Then, the surface of the metallic tape base material was finished to a surface roughness Ra of 0.0011 μm by mechanical polishing.

A GZO layer, an IBAD-MgO layer, a LMO layer, a CeO$_2$ layer, a superconducting layer and a protective layer were formed according to the method described in Example 1.

(Cutting)

The tape base material was separated by a slit processing method into 5 strips of a superconducting wire material each having a width of 4 mm and a length of 300 m. Furthermore, oxygen annealing was carried out under an oxygen flow atmosphere at 550° C., as a result of which a superconducting wire material was obtained.

When the cut faces were visually observed, protruding traces that were considered to be generated by shearing at the slit processing were observed.

A part of the produced superconductor wire material that had a length of 200 m were measured with respect to threshold current (Ic) in a state of being immersed in liquid nitrogen using the four-terminal method. The measurement was carried out with a pitch of 1 m, and the distance between voltage terminals was set to 1.2 m. Electrical conduction characteristics of the superconducting wire material were measured with a definition of 1 μV/cm.

A threshold current (Ic) of 84 A or more was confirmed at all measurement positions.

TABLE 1

|  | Dimensions of wire material (thickness × width) | Superconducting characteristics [A] (minimum value of minimum shape unit) | The number of grooves in wire material after cutting |
|---|---|---|---|
| Example 1 | 0.1 mm × 10 mm | (at width of 10 mm) 290 A | 0 |
| Example 2 | 0.1 mm × 4 mm | (at width of 4 mm) 96 A | 0 |
| Example 3 | 0.1 mm × 10 mm | (at width of 2 mm) 48 A | 3 slits (four-division structure) |
| Comparative Example 1 | 0.1 mm × 4 mm | (at width of 4 mm) 84 A | 0 |

The superconducting characteristics of the superconducting wire materials obtained in Examples 1 to 3 and Comparative Example 1 are shown in Table 1. In Example 1, it was confirmed that a threshold current (Ic) comparable to conventional wire materials was obtained even in a case in which slit processing into a width of 10 mm was carried out. It is also found that Example 2 exhibits an Ic higher than that of Comparative Example 1 although the dimensional shapes are the same. Furthermore, in Example 3 in which a four-division structure was employed, an Ic measured with a width of 2 mm on each strip was 48 A, which is confirmed to be exactly half the Ic of Example 2 in which a strip having a width of 4 mm and being free of division structure was employed. This demonstrates that the performance of the superconducting layer portion between grooves was not deteriorated by the dividing.

Examples 4-1 to 4-11

A low-magnetic non-oriented metallic tape base material (HASTELLOY (registered trademark, produced by Haynes International, Inc.), which is a nickel-based heat-resistant and corrosion-resistant alloy) was prepared. This material had a shape of 0.25 mm in thickness×35 mm in width. The tape base material was processed into a tape base material of 0.2 mm in thickness×35 mm in width×250 m, using a 12-stage rolling machine having a roll diameter φ of 20 mm.

Next, U-shaped grooves each having a groove depth of 50 μm and a groove opening width of 0.5 mm were formed using a grooving roll, and cold rolling was also carried out. 13 lines of U-shaped grooves were arranged with a pitch of 2 mm in the width direction, and were shaped to extend parallel to each other in the longitudinal direction. Then, cold rolling was continued, as a result of which a tape base material of 0.1 mm in thickness×35 mm in width having 13 grooves were produced. The groove depth of the resultant tape base material was 25 μm, and the width of the opening at the top of each groove was 0.5 mm.

In the latter stage of the process of cold rolling, a shaping processing of the inside of each groove was carried out using a grooving roll. The surface roughness Ra of the bottom of each groove was adjusted within a range of from 0.01 to 60 μm as shown in Table 2, for each of the tape base materials of Example 4-1 to 4-11.

Then, TA (tension annealing treatment) was carried out with a view to improving the shape, whereby a flat metallic substrate was obtained. Thereafter, the surface of the metallic tape base material was finished to a surface roughness Ra of 0.0012 μm by mechanical polishing.

A GZO layer, an IBAD-MgO layer, a LMO layer, a $CeO_2$ layer, a superconducting layer and a protective layer were formed, and cutting was carried out, both according to the method described in Example 3.

Each of the superconducting wire materials of Examples 4-1 to 4-11, which had a surface roughness Ra of the bottom of each groove of from 0.01 to 60 μm, was measured with respect to threshold current (Ic) at a groove portion, and the electrical conduction characteristics at the groove portion were evaluated. The results obtained are shown in Table 2.

—Electrical Conduction in Longitudinal Direction—

An electric current was allowed to flow in the longitudinal direction along the groove portion, and the electrical conduction in the longitudinal direction of the groove portion was evaluated. A case in which threshold current (Ic) was not detected (0 A) in the measurement was evaluated as 'A', and a case in which Ic was detected was evaluated as 'B'.

—Electrical Conduction in Width Direction—

Furthermore, an electric current was allowed to flow in the width direction of the superconducting wire material, and the electrical conduction in the width direction was evaluated. A case in which threshold current (Ic) was not detected (0 A) in the measurement was evaluated as 'A', and a case in which Ic was detected was evaluated as 'B'.

—Superconducting Characteristics—

The superconducting wire material for the evaluation was separated, at positions of the grooves on the surface of the tape base material, into 3 stripes of a superconducting wire material each having a width of 8 mm and a length of 250 m by slit processing method. The resultant 8 mm-wide tape base material had preformed grooves (some of the 13 grooves described above) with a pitch of 2 mm that divided the width direction into four portions.

A threshold current (Ic) was measured using the four-terminal method in a state in which the resultant superconducting wire material was immersed in liquid nitrogen. The measurement was carried out with a pitch of 1 m, and the distance between voltage terminals was set to 1.2 m. Electrical conduction characteristics of the superconducting wire material were measured with a definition of 1 μV/cm.

A case in which the threshold current (Ic) obtained by the measurement was 190 A or more was evaluated as 'A', and a case in which the Ic was less than 180 A was evaluated as 'B'.

TABLE 2

| Examples | Ra of bottom of groove [μm] | Electrical conduction in longitudinal direction | Electrical conduction in width direction | Superconducting characteristics |
|---|---|---|---|---|
| 4-1 | 0.01 | B | B | A |
| 4-2 | 0.02 | A | B | A |
| 4-3 | 0.08 | A | B | A |
| 4-4 | 0.1 | A | A | A |
| 4-5 | 0.5 | A | A | A |
| 4-6 | 1 | A | A | A |
| 4-7 | 5 | A | A | A |
| 4-8 | 15 | A | A | A |
| 4-9 | 20 | A | A | B |
| 4-10 | 50 | A | A | B |
| 4-11 | 60 | A | B | B |

Based on Table 2, an influence of a change in numerical value of the surface roughness Ra of the bottom of the groove on the characteristics is discussed below.

In a case in which the surface roughness Ra of the bottom of the groove was less 0.02 μm (Example 4-1), a slight threshold current (Ic) was detected in the longitudinal direction of the groove portion. This is presumed to be caused by formation of an electric current path due to slight orientation of the superconducting layer on the intermediate layer deposited in the groove. In a case in which the surface roughness Ra of the bottom of the groove was less than 0.1 μm (Examples 4-1 to 4-3), a very slight threshold current (Ic) was detected discontinuously in the width direction of the groove portion. This is presumed to be caused by formation of a discontinuous electric current path due to slight orientation of the superconducting layer on the intermediate layer deposited in the groove.

It was also found that, in a case in which the surface roughness Ra of the bottom of the groove exceeded 15 μm (Examples 4-9 to 4-11), the superconducting characteristics were decreased. The reason therefor is presumably that the groove was dotted with macro protrusions and fine powder, and that the scattering and adhesion of the fine powder of deposited components contaminates the intermediate layer, and that the contamination affected the orientation of the superconducting layer.

Furthermore, it was also found that, in a case in which the surface roughness Ra of the bottom of the groove exceeded 50 μm (Example 4-11), slight electrical conduction occurred in the width direction of the groove portion. This is presumed to be caused by formation of an electric current path in the width direction due to abnormal discharge that occurred from the protrusions at the groove as a starting point, and due to scattering and adhesion of the fine powders of the deposited components.

REFERENCE CHARACTERS

100: Base material
10, 110: Substrate
20A: Corner covering portion
22, 122: Bed layer
24, 124: Biaxially oriented layer
26, 126: First cap layer
28, 128: Second cap layer
30, 130: Superconducting layer
30A: Corner covering portion
40, 140: Protective layer
40A: Corner covering portion
50: Groove (First groove)
52: Second groove

The invention claimed is:

1. A method for producing a superconductive conductor, the method comprising:
  forming a superconducting layer on a surface of a base material wherein the surface of the base material has a first groove; and
  cutting completely through the base material along the first groove.

2. The method of claim 1, wherein a depth of the first groove is greater than or equal to a thickness of the superconducting layer, but less than a thickness of the base material.

3. The method of claim 1, wherein an opening area of an uppermost portion of the first groove is larger than an area of a bottom face of the first groove.

4. The method of claim 1, wherein a surface roughness Ra of an inner wall face of the first groove is 0.02 μm or more.

5. The method of claim 1, wherein the base material is a substrate having an intermediate layer disposed thereon.

6. The method of claim 5, wherein the first groove is formed on at least one surface of the substrate, and the intermediate layer is disposed on a surface at a side at which the first groove is formed.

7. The method of claim 1, wherein the base material further has a second groove on a surface of the base material at a side opposite to the surface on which the first groove is formed.

8. The method of claim 1, wherein the first groove is continuous from one end of the base material to the other end of the base material.

9. The method of claim 5, wherein the cutting is carried out after at least the intermediate layer is formed.

10. The method of claim 1, wherein the cutting is carried out after the superconducting layer is formed.

11. A superconductive conductor comprising:
  a base material having a first groove on at least one surface thereof; and
  a superconducting layer that is formed on a surface of the base material at a side at which the first groove is formed, except on at least the first groove,
  wherein the superconducting layer covers corner portions at which the face of the base material on which the superconducting layer is formed contacts respective inner wall faces of the first groove of the base material.

12. The superconductive conductor of claim 11, wherein a depth of the first groove is greater than or equal to a thickness of the superconducting layer but less than a thickness of the base material.

13. The superconductive conductor of claim 11, wherein a surface roughness Ra of an inner wall face of the first groove is 0.02 μm or more.

14. The superconductive conductor of claim 11, wherein the base material further has a second groove on a surface of the base material opposite to the surface on which the first groove is formed.

15. The superconductive conductor of claim 11, wherein the first groove is continuous from one end of the base material to the other end of the base material.

16. A substrate wherein one face of the substrate has a surface roughness Ra of less than 0.02 μm, wherein a first groove is formed on the one face and second groove on a face of the substrate opposite to the face on which the first groove is formed.

17. The substrate of claim 16, wherein each side face of the substrate, each inner wall face of the first groove, and a bottom face of the first groove has a surface roughness Ra of 0.02 μm or more.

18. The method of claim 1, wherein a surface roughness Ra of an inner wall face of the first groove is 0.02 to 50 μm.

19. The method of claim 1, wherein a surface roughness Ra of an inner wall face of the first groove is 0.1 to 15 μm.

* * * * *